United States Patent [19]

Deboo et al.

[11] 4,282,479
[45] Aug. 4, 1981

[54] TEST APPARATUS FOR LOCATING SHORTS DURING ASSEMBLY OF ELECTRICAL BUSES

[75] Inventors: Gordon J. Deboo, Sunnyvale; David J. Devine, San Jose, both of Calif.

[73] Assignee: The United States of America as represented by the Administrator of the National Aeronautics and Space Administration, Washington, D.C.

[21] Appl. No.: 69,485

[22] Filed: Aug. 24, 1979

[51] Int. Cl.³ .............................................. G01R 31/02
[52] U.S. Cl. .......................................... 324/51; 324/52
[58] Field of Search ................. 324/51, 52, 66, 73 R; 340/651, 652; 29/739, 741, 755, 624, 628, 630 R, 630 A

[56] References Cited

U.S. PATENT DOCUMENTS

| | | | |
|---|---|---|---|
| 2,814,774 | 11/1957 | Wong | 324/51 |
| 3,103,808 | 9/1963 | Eichelberger | 324/51 X |
| 3,480,856 | 11/1969 | Scott | 324/51 |
| 3,495,172 | 2/1970 | Davis | 324/51 |
| 3,546,581 | 12/1970 | Herrendeen et al. | 324/54 |
| 3,699,432 | 10/1972 | Brown | 324/51 |
| 3,713,019 | 1/1973 | Van Bosse | 324/51 |
| 3,795,860 | 3/1974 | Sylvan | 324/51 X |
| 4,013,947 | 3/1977 | Arai | 324/51 |
| 4,015,200 | 3/1977 | Strandh | 324/51 |
| 4,019,129 | 4/1977 | Grau | 324/51 X |

Primary Examiner—Gerard R. Strecker
Attorney, Agent, or Firm—Darrell G. Brekke; John R. Manning

[57] ABSTRACT

A test apparatus for locating electrical shorts that is especially suited for use while an electrical circuit is being fabricated or assembled. A ring counter derives input pulses from a squarewave oscillator. The outputs of the counter are fed through transistors to an array of light emitting diodes. Each diode is connected to an electrical conductor, such as a bus bar, that is to be tested. In the absence of a short between two electrical conductors the diodes are sequentially illuminated. When a short occurs, a comparator/multivibrator circuit triggers an alarm and stops the oscillator and the sequential energization of the diodes. The two diodes that remain illuminated identify the electrical conductors that are shorted.

3 Claims, 2 Drawing Figures

TEST APPARATUS FOR LOCATING SHORTS DURING ASSEMBLY OF ELECTRICAL BUSES

DESCRIPTION

ORIGIN OF THE INVENTION

The invention described herein was made by an employee of the United States Government and may be manufactured and used by or for the Government for governmental purposes without the payment of any royalties thereon or therefor.

TECHNICAL FIELD

The present invention relates to an electrical short finding instrument and more particularly to one suited for locating shorts as they occur while an electrical system is being fabricated.

BACKGROUND ART

In complex electrical systems such as computers it is common to use power and grounding bus bars or rails. Often these bus bars have hundreds or even thousands of wires connected thereto. After the wires are attached to the bus bars and the circuits are inspected, shorts are invariably discovered, especially when the terminals are closely spaced. It is very difficult and time consuming to detect these wiring errors. If the system is energized before shorts are removed, components in the system can be damaged.

In the past, searches for shorts were normally conducted after the electrical equipment was completed, not during the actual assembly process. Often an ohmmeter was used to hunt for shorts.

Some test instruments have been designed to detect shorts in assembled cables. They require a connector for each end of the cable under test and they utilize complex circuits, slow unreliable mechanical switching devices, or high voltages. Representative cable testing devices are disclosed in U.S. Pat. Nos. 2,814,774; 3,480,856; and 4,015,200.

U.S. Pat. No. 3,713,019 describes an apparatus for sequentially examining points in an electrical matrix so as to detect failures in components such as transistors. A transformer is required at every sensing station and the switching is accomplished with relays.

DISCLOSURE OF INVENTION

Inasmuch as it is cost effective to locate electrical shorts as they occur during the assembly process of complex bus bar circuits, it is an object of the subject invention to provide an instrument that generates an audible warning as soon as a shorting-type wiring error is made.

It is another object of this invention to provide a visual indication of the actual bus bars that have erroneously been brought together in electrical contact.

It is still a further object of the instant invention to provide a real time electrical short locator that can quickly and reliably scan many bus bars and operate from a lowvoltage battery power supply.

Briefly, the electrical short locator in accordance with the above objects requires only a single connection to the bus bar or conductor under test. A light emitting diode is provided for each bus bar, rail or electrical conductor to be tested. Each diode is serially connected to a bipolar transistor and the transistors are normally sequentially activated. The current through the transistors and diodes passes through a common resistor. When a short occurs, the voltage drop sensed across the resistor triggers a sonic alarm and stops the sequential activation of the light emitting diodes. The diodes corresponding to the shorted bus bars remain illuminated until the short is removed.

DESCRIPTION OF THE PREFERRED EMBODIMENT

Figure 1:
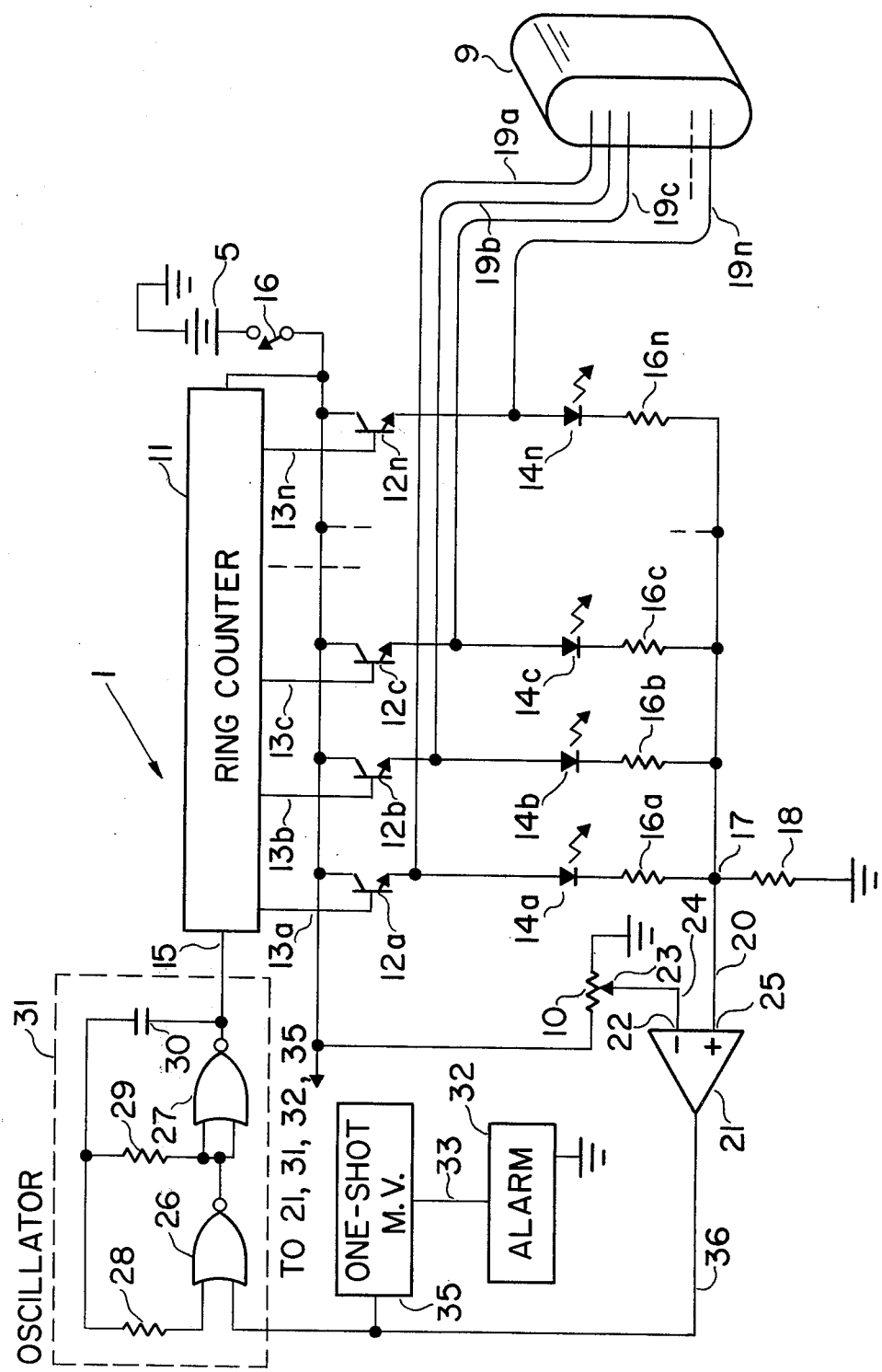
FIG. 1 is a schematic diagram of an electrical short locator circuit in accordance with the principles of the invention.
Figure 2:
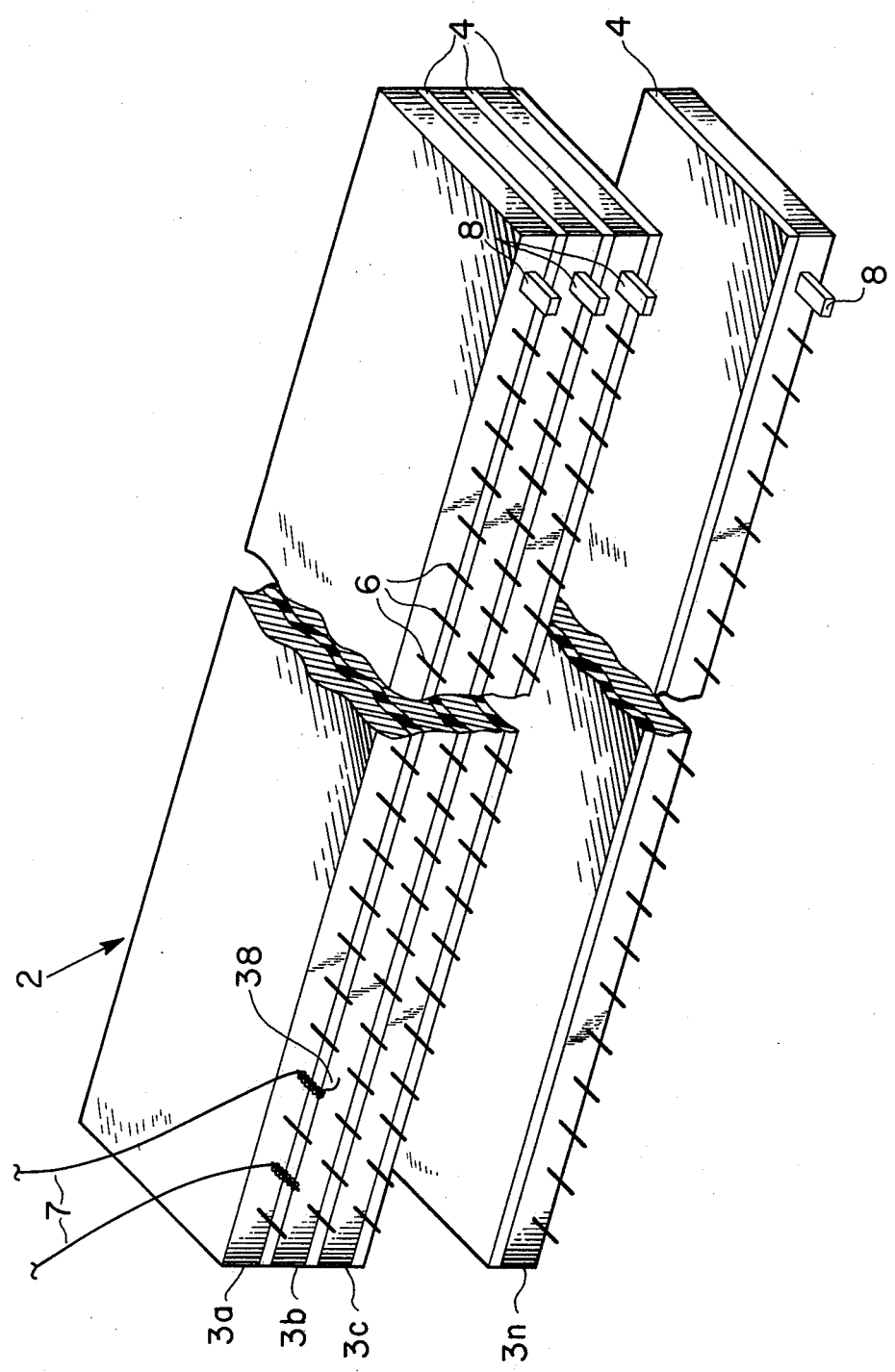
FIG. 2 is a perspective view of a bus bar assembly that may be tested with the electrical short locator.

Referring to the drawings, the electrical short locator is shown at 1 and a typical bus bar assembly on which the locator may be employed is depicted at 2 (FIG. 2). Bus bars 3a, 3b, 3c, 3n are separated from eaach other by electrical insulators 4. Pin-like terminals 6 are affixed to each of the bus bars, and electrical leads 7 are connected to the terminals by conventional solder or wire-wrap techniques. Each bus bar 3a–3n has a plug 8. These plugs typically are used to connect bus bars to remote circuits such as power sources. Socket 9 (shown in FIG. 1) mates with plugs 8 and it enables the electrical short locator 1 to be brought into electrical communication with the bus bars 3a–3n.

The bases of bipolar transistors 12a, 12b, 12c and 12n are connected to the outputs of ring counter 11 by leads 13a, 13b, 13c and 13n. Ring counter 11 may be, for example, single or cascaded CMOS 4017's or 4022's. The collectors of the transistors are commonly joined between one fixed terminal of potentiometer 10 and SPST switch 16. The other terminal of switch 16 is connected to a d-c power supply 5. The emitters of the NPN transistors 12a, 12b, 12c, 12n are connected to the anodes of light emitting diodes, LED's, 14a, 14b, 14c, 14n, respectively. Resistors 16a, 16b, 16c, 16n, are connected between the cathodes of the LED's and node 17. Resistor 18 is coupled between node 17 and ground. Conductors or leads 19a, 19b, 19c, 19n extend from the emitters of transistors 12a–12n to socket 9. The conductors are so arranged within the socket so that when socket 9 is connected with plugs 8, conductor 19a makes electrical contact with the uppermost plug, conductor 19b makes contact with the second-from-the-top plug, and so forth. Conductors 19a–19n need not terminate in a socket. If desired, each conductor may terminate in a test clip such as an alligator clip. The clips may be fastened to a terminal on the bus bar or to the bus bar itself.

A comparator 21 has a first input 22 coupled to wiper 23 of potentiometer 10 by means of lead 24. The second input 25 of comparator 21 is connected to node 17 via lead 20.

NOR gates 26 and 27 are interconnected with resistors 28, 29 and capacitor 30 so as to form a squarewave oscillator 31. For example, a waveform with a frequency of 1 Hz is generated when resistors 28 and 29 are 1 MΩ and 390 KΩ, respectively, and capacitor 30 has a value of 0.22 μF. The clock pulses for ring counter 11 are provided by oscillator 31 and carried to the counter on conductor 15. Alarm 32 is coupled to a one-shot multivibrator 35 by means of lead 33. When a pulse, preferable with a period of at least five seconds, is released from one-shot multivibrator 35, sound is produced from alarm 32 for the duration of the pulse.

Alarm 32 may be a bell, a buzzer, or a piezoelectric sounder such as the Sonalert manufactured by Mallory. The output of comparator 21 is coupled to the input of multivibrator 35 and one input of NOR gate 26 by conductor 36. Power for the entire electrical short locator is supplied by power supply 5.

The subject electrical short locator is highly suited to detecting shorts at the time they are made, that is, during the process of adding leads 7 to terminals 6. In operation, the assembler connects conductors 19a–19n to bus bars 3a–3n, respectively, by connecting socket 9 to plugs 8, and closes power switch 16. When the power is on, a train of positive pulses is fed to ring counter 11. Each time a pulse enters counter 11, a positive pulse of equal duration is generated on a different counter output lead. Leads 13a–13n receive the positive output pulses in sequential order. At any given time all counter output leads 13a–13n are grounded except one. The positive output pulses are channeled to the transistor bases and thus the transistors are sequentially biased into conduction and likewise the LED's are sequentially biased into conduction. That is, when a positive pulse emanates from counter 11 on lead 13a, transistor 12a and LED 14a simultaneously conduct for the duration of the positive pulse. As soon as these semiconductors stop conducting, semiconductors 12b and 14b and conduct, and so forth. If oscillator 31 has a frequency of 1 Hz, the LED's will sequentially glow and each will glow for a period of 0.5 seconds.

The wiper 23 of potentiometer 10 is adjusted so that a reference voltage is produced on input 22 that is slightly greater than the voltage across resistor 18 (and at comparator input 25) when no bus bar short is present.

When two bus bars become shorted, the LED's stop conducting in sequence and the two particular LED's associated with the shorted bus bars continue to provide a visual indication until the short is removed or power switch 16 is opened. For example, when end 38 of lead 7 touches bus bar 3b and causes bus bar 3a to be shorted to bus bar 3b, the anode of LED 14b is connected to the anode of LED 14a. Consequently, when a positive pulse reaches the base of transistor 12a after the short occurs, LED's 14a and 14b both conduct and generate a visual indication. The current through resistors 16a and 16b also flows through resistor 18. With LED's 14a and 14b both conducting, the resulting current through resistor 18 produces a voltage drop across the resistor which exceeds the reference voltage on input 22 of comparator 21. The output of comparator 21 goes from ground potential to a positive potential and performs two tasks. It stop oscillator 31 (by switching the output of NOR gate 18a to ground potential) and it triggers one-shot multivibrator 35. The pulse from the multivibrator turns on alarm 32 for the duration of the pulse. Thus, as soon as the assembler hears alarm 32, he knows that a short has been created. By observing that LED's 14a and 14b are illuminated, the assembler knows that the short occurs between bus bar 3a and bus bar 3b. Without pulses from oscillator 31, the positive pulse originally applied to the base of transistor 12a by ring counter 11 will be extended indefinitely. Consequently, LED's 14a and 14b will remain illuminated until the short is discovered and removed. As soon as the short is removed, the current through resistor 18 will drop, the comparator output will swing to ground potential, oscillator 31 will start up, the LED's will again be sequentially illuminated, and the test circuit will once again be ready to detect an inadvertent short.

Transistors 12a–12n serve two useful functions. They amplify the LED currents and they protect the ring counter when a short occurs. Specifically, under a short circuit condition the transistors isolate a high-level counter output from a low-level output. Stating it another way, the transistors prevent the grounding of the counter output with the positive voltage.

While one specific embodiment of the invention has been described in detail above, it is to be understood that various modifications may be made from the specific details described without departing from the spirit and scope of the invention. The invention is applicable to any electrical system involving complex wiring wherein it is desired to achieve real time discovery of wiring errors. When the number of busses or conductors is very large, the scanning rate can be increased by changing the values of resistors 28, 29 and capacitor 30 so as to increase the oscillator frequency.

We claim:

1. Test apparatus for locating shorts between electrical buses in a bus system having n buses, said apparatus comprising:

means for generating pulses at a predetermined rate;

means having n outputs and an input coupled to said pulse generating means for sequentially emitting pulses at said n outputs at said predetermined rate;

a resistor having first and second terminals, said first terminal being grounded;

n indicator circuits each including an electric lamp coupled between said resistor second terminal and a different output of said pulse emitting means, said output pulses from said pulse emitting means causing said lamps to be sequentially energized at said predetermined rate and a maximum voltage V to be produced across said resistor when no buses are shorted together;

a single conductor linking each indicator circuit lamp to a different bus;

a comparator having first and second inputs and an output, said first input being connected to said second terminal of said resistor;

means for producing a fixed voltage slightly greater than V and applying it to said second input of said comparator;

a sonic alarm;

means coupled to said output of said comparator for turning on said alarm for a predetermined period and switching off said means for generating pulses when said voltage at said first comparator input exceeds said voltage at said second comparator input;

a short condition between two of said buses causing: said voltage across said resistor to exceed said voltage applied to said second comparator input; said means for generating pulses to stop generating pulses; and said electric lamps associated with said shorted buses to remain illuminated until said short condition is removed.

2. Test apparatus as set forth in claim 1 wherein said means for sequentially emitting pulses is a ring counter and said means for turning on said alarm for a predetermined period is a one-shot multivibrator.

3. Test apparatus as claimed in claim 2 wherein each indicator circuit includes a transistor switch controlled by said pulses emitted from said ring counter.

* * * * *